United States Patent
Jaaskelainen et al.

(10) Patent No.: US 9,188,694 B2
(45) Date of Patent: Nov. 17, 2015

(54) OPTICAL INTERFEROMETRIC SENSORS FOR MEASURING ELECTROMAGNETIC FIELDS

(71) Applicant: HALLIBURTON ENERGY SERVICES, INC., Houston, TX (US)

(72) Inventors: Mikko Jaaskelainen, Katy, TX (US); Tasneem A. Mandviwala, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 80 days.

(21) Appl. No.: 13/679,940

(22) Filed: Nov. 16, 2012

(65) Prior Publication Data

US 2014/0139226 A1 May 22, 2014

(51) Int. Cl.
*G01V 3/26* (2006.01)
*G01R 33/032* (2006.01)

(52) U.S. Cl.
CPC ............. *G01V 3/26* (2013.01); *G01R 33/032* (2013.01)

(58) Field of Classification Search
CPC .. G01R 33/032; G01R 33/02; G01R 33/0327; G02B 6/4401; Y10S 359/90; Y10S 358/00; Y10S 73/02; G01V 3/26
USPC ........................................ 324/244, 260, 244.1
See application file for complete search history.

(56) References Cited

U.S. PATENT DOCUMENTS

| | | | |
|---|---|---|---|
| 4,348,587 A | 9/1982 | Tangonan et al. | |
| 4,376,248 A | 3/1983 | Giallorenzi et al. | |
| 4,433,291 A * | 2/1984 | Yariv et al. | 324/244.1 |
| 4,622,460 A | 11/1986 | Failes et al. | |
| 4,753,529 A * | 6/1988 | Layton | 356/479 |
| 4,868,495 A | 9/1989 | Einzig et al. | |

(Continued)

FOREIGN PATENT DOCUMENTS

| | | | | |
|---|---|---|---|---|
| GB | 2166864 A * | 5/1986 | | G01R 33/02 |
| GB | 2433112 A | 6/2007 | | |

(Continued)

OTHER PUBLICATIONS

International Search Report and Written Opinion issued Jan. 10, 2014 for PCT Patent Application No. PCT/US2013/064115, 10 pages.

(Continued)

*Primary Examiner* — Jay Patidar
(74) *Attorney, Agent, or Firm* — Scott Brown; Tumey L.L.P.

(57) ABSTRACT

A method of measuring an electromagnetic field in a formation can include installing an electromagnetic sensor with improved sensitivity, the sensor including multiple optical waveguides and respective multiple materials, and in response to exposure to the electromagnetic field, the materials changing shape in opposite directions. A well system can include an optical electromagnetic sensor which measures an electromagnetic field in a formation, and wherein optical path lengths or phases in optical waveguides of the sensor change both positively and negatively in response to exposure to the electromagnetic field. A method of monitoring a formation can include installing an optical electromagnetic sensor in a wellbore which penetrates the formation, and an optical path length/phase in an optical waveguide of the sensor increasing in response to exposure to the electromagnetic field, and an optical path length/phase in another optical waveguide of the sensor decreasing in response to exposure to the electromagnetic field.

8 Claims, 7 Drawing Sheets

(56) References Cited

U.S. PATENT DOCUMENTS

| | | | |
|---|---|---|---|
| 4,918,371 A | 4/1990 | Bobb | |
| 5,171,981 A * | 12/1992 | Wood | 250/227.14 |
| 5,305,075 A * | 4/1994 | Bucholtz et al. | 356/477 |
| 5,471,139 A | 11/1995 | Zadoff | |
| 5,491,335 A * | 2/1996 | Bucholtz et al. | 250/227.25 |
| 5,706,079 A * | 1/1998 | Kersey | 356/5.09 |
| 5,754,284 A | 5/1998 | Leblanc et al. | |
| 5,898,517 A | 4/1999 | Weis | |
| 6,289,740 B1 | 9/2001 | Posey, Jr. et al. | |
| 6,294,917 B1 | 9/2001 | Nichols | |
| 6,314,056 B1 | 11/2001 | Bunn et al. | |
| 6,463,186 B1 | 10/2002 | Li | |
| 6,480,000 B1 | 11/2002 | Kong et al. | |
| 6,724,469 B2 | 4/2004 | Leblanc | |
| 6,747,743 B2 | 6/2004 | Skinner et al. | |
| 6,809,516 B1 | 10/2004 | Li et al. | |
| 6,957,576 B2 | 10/2005 | Skinner et al. | |
| 7,453,763 B2 | 11/2008 | Johnstad | |
| 8,035,393 B2 | 10/2011 | Tenghamn et al. | |
| 8,172,007 B2 | 5/2012 | Dolman et al. | |
| 2001/0023614 A1 | 9/2001 | Tubel et al. | |
| 2003/0057950 A1 | 3/2003 | Gao et al. | |
| 2003/0205375 A1 | 11/2003 | Wright et al. | |
| 2005/0034863 A1 | 2/2005 | Dillenbeck et al. | |
| 2006/0028208 A1 | 2/2006 | Strack et al. | |
| 2006/0038115 A1 * | 2/2006 | Maas | 250/227.18 |
| 2006/0081412 A1 | 4/2006 | Wright et al. | |
| 2007/0046289 A1 | 3/2007 | Troxler | |
| 2008/0042636 A1 | 2/2008 | Koste et al. | |
| 2008/0180681 A1 * | 7/2008 | Digonnet | 356/477 |
| 2009/0199630 A1 | 8/2009 | DiFoggio et al. | |
| 2010/0046002 A1 | 2/2010 | Perez et al. | |
| 2010/0316328 A1 | 12/2010 | Arias Vidal et al. | |
| 2011/0084696 A1 | 4/2011 | Tenghamn et al. | |
| 2011/0088462 A1 | 4/2011 | Samson et al. | |
| 2011/0090496 A1 | 4/2011 | Samson et al. | |
| 2011/0139447 A1 | 6/2011 | Ramos et al. | |
| 2011/0170112 A1 | 7/2011 | Gibler et al. | |
| 2011/0292763 A1 | 12/2011 | Coates et al. | |
| 2011/0298461 A1 | 12/2011 | Bittar et al. | |
| 2011/0308788 A1 | 12/2011 | Ravi et al. | |
| 2012/0001625 A1 | 1/2012 | Yamada et al. | |
| 2012/0013893 A1 | 1/2012 | Maida et al. | |
| 2012/0014211 A1 | 1/2012 | Maida, Jr. et al. | |
| 2012/0061084 A1 | 3/2012 | Sweatman et al. | |
| 2012/0126993 A1 | 5/2012 | Samson et al. | |
| 2012/0147381 A1 | 6/2012 | Leblanc et al. | |
| 2012/0179378 A1 | 7/2012 | Duncan et al. | |
| 2012/0205103 A1 | 8/2012 | Ravi et al. | |
| 2012/0212229 A1 | 8/2012 | Sinclair et al. | |
| 2012/0234605 A1 | 9/2012 | Donderici et al. | |
| 2012/0250017 A1 * | 10/2012 | Morys et al. | 356/335 |
| 2012/0257475 A1 | 10/2012 | Luscombe et al. | |
| 2014/0139225 A1 | 5/2014 | Mandviwala | |

FOREIGN PATENT DOCUMENTS

| | | |
|---|---|---|
| GB | 2452609 A | 3/2009 |
| JP | 2011069700 A | 4/2011 |
| WO | WO 2012/028846 A2 * | 3/2012 |

OTHER PUBLICATIONS

International Search Report and Written Opinion issued Jan. 10, 2014 for PCT Patent Application No. PCT/US2013/064122, 10 pages.

Specification and Drawing for U.S. Appl. No. 13/736,324, filed Jan. 8, 2013, 21 pages.

Specification and Drawing for U.S. Appl. No. 13/226,578, filed Sep. 7, 2011, 30 pages.

Specification and Drawing for U.S. Appl. No. 13/726,054, filed Dec. 22, 2012, 24 pages.

Specification and Drawing for U.S. Appl. No. 13/418,455, filed Mar. 13, 2012, 27 pages.

Specification and Drawing for U.S. Appl. No. 13/426,414, filed Mar. 21, 2012, 30 pages.

Specification and Drawing for U.S. Appl. No. 13/655,607, filed Oct. 19, 2012, 32 pages.

Specification and Drawing for U.S. Appl. No. 13/253,788, filed Oct. 5, 2011, 23 pages.

Campanella, Humberto et al.; "Comparative performance of static-mode ferrous MEMS gradiometers fabricated by a three-step DRIE process", Journal of Micromechanics and Microengineering, vol. 20, No. 4, dated May 21, 2010, 10 pages.

Specification and drawings for U.S. Appl. No. 13/648,897, filed Oct. 10, 2012, 19 pages.

Specification and drawings for U.S. Appl. No. 13/679,940, filed Nov. 16, 2012, 34 pages.

Optics Letters; "Fiber-Optic AC Electric-Field Sensor Based on the Electrostrictive Effect", vol. 17, No. 5, dated Mar. 1, 1992, 3 pages.

Office Action issued Apr. 25, 2014 for U.S. Appl. No. 13/679,926, 31 pages.

Office Action issued Jul. 25, 2014 for U.S. Appl. No. 13/679,926, 23 pages.

* cited by examiner

OPTICAL INTERFEROMETRIC SENSORS FOR MEASURING ELECTROMAGNETIC FIELDS

BACKGROUND

This disclosure relates generally to equipment utilized and operations performed in conjunction with a subterranean well and, in an example described below, more particularly provides optical push-pull interferometric sensors for electromagnetic sensing.

It can be useful to monitor a subterranean reservoir over time, in order to detect changes in the reservoir. For example, in conventional and enhanced oil recovery, processes such as water flooding, steam flooding and chemical flooding can be implemented. It is useful to monitor injection of water, steam or chemicals into a formation, and/or to monitor progress of the water, steam or chemicals toward or away from one or more wellbores. Monitoring a flood front helps avoid flood breakthroughs, and thereby optimize hydrocarbon production, and can also save costs by reducing an amount of steam, water and/or chemicals used.

Therefore, it will be appreciated that improvements are continually needed in the art of monitoring changes in subterranean reservoirs. Such improvements may be used for monitoring flood front progress, for monitoring other changes in an earth formation, or for other purposes.

DETAILED DESCRIPTION

Figure 1:
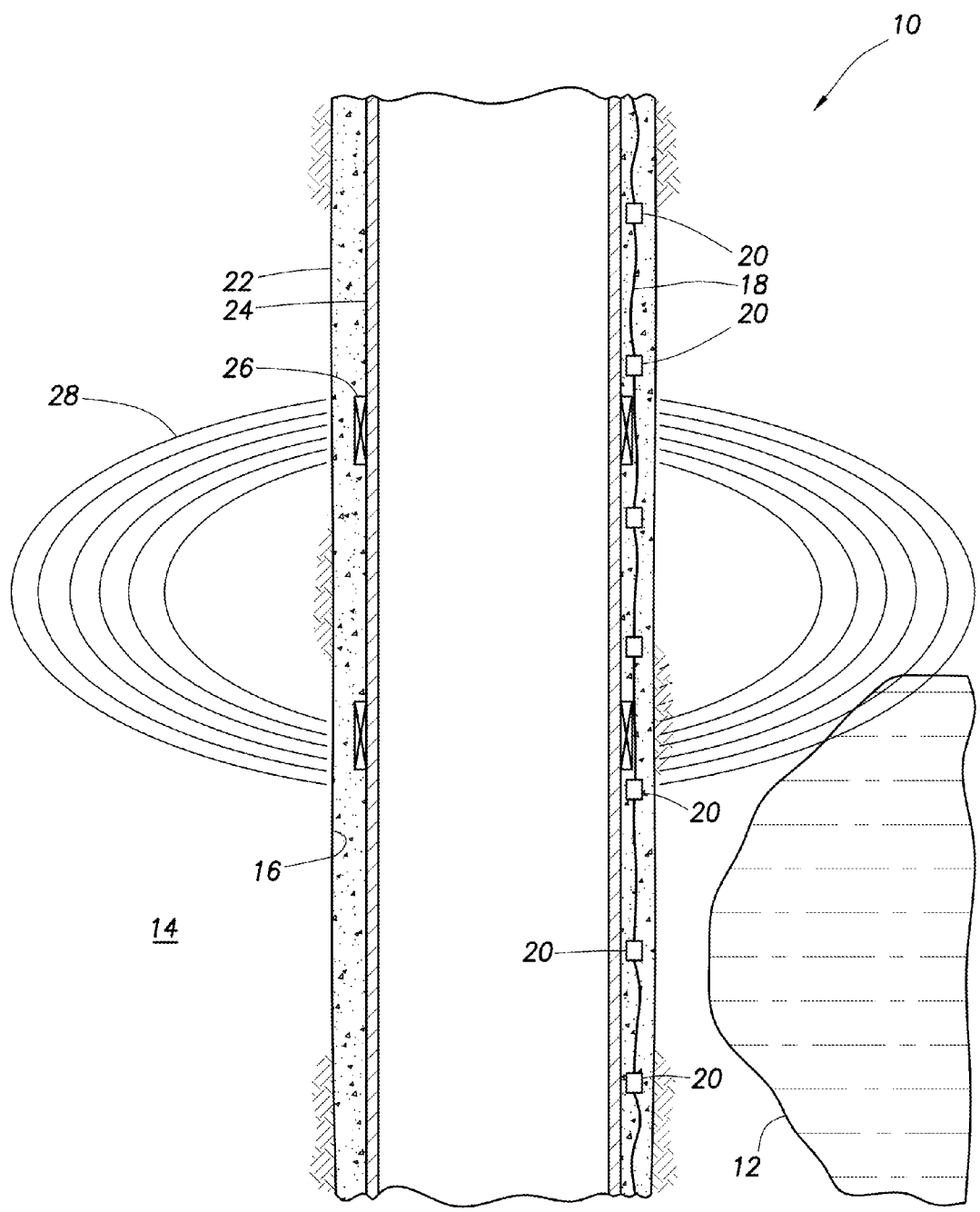
FIG. 1 is a representative partially cross-sectional view of a well system and associated method which can embody principles of this disclosure.

Representatively illustrated in FIG. 1 is a system 10 for use with a subterranean well, and an associated method, which system and method can embody principles of this disclosure. However, it should be clearly understood that the system 10 and method are merely one example of an application of the principles of this disclosure in practice, and a wide variety of other examples are possible. Therefore, the scope of this disclosure is not limited at all to the details of the system 10 and method described herein and/or depicted in the drawings.

In the FIG. 1 example, the system 10 is used to monitor a flood front 12 as it progresses through an earth formation 14. For this purpose, optical electromagnetic sensors 20 are installed in a wellbore 16 along an optical cable 18. The cable 18 and sensors 20 are positioned in cement 22 surrounding casing 24.

The flood front's 12 progress may be monitored toward or away from the wellbore 16, or another characteristic of the formation 14 could be monitored, etc. Thus, the scope of this disclosure is not limited to the details of the example depicted in FIG. 1.

In the FIG. 1 system 10, monitoring of the flood front 12 is accomplished by detecting changes in the formation 14 over time. This is preferably accomplished by measuring resistivity contrasts. The resistivity of the formation 14 is obtained through the measurement of electromagnetic fields in the formation using the optical electromagnetic sensors 20, which are preferably permanently installed in the wellbore 16, so that continuous monitoring over time is available.

A transmitter 26 can be used to generate electromagnetic energy consisting of electric and magnetic field components. Thus, electromagnetic fields 28 (e.g., primary, secondary, etc., fields) are induced in the formation 14. However, it should be clearly understood that the scope of this disclosure is not limited at all to any particular way of inducing electromagnetic fields in a formation, or to any particular type of electromagnetic fields induced in a formation.

The transmitter 26 could comprise coils external to the casing 24. In other examples, the casing 24 itself could be used to generate the electromagnetic fields 28, such as, by using the casing as a conductor.

In further examples, the transmitter 26 could be positioned in another wellbore, at the earth's surface, or in another location. The scope of this disclosure is not limited to any particular position of a transmitter, to any particular type of transmitter, or to any particular technique for generating an electromagnetic field in the formation 14.

The sensors 20 detect the electromagnetic field 28. Measurements of the electromagnetic field 28 are then inverted to obtain the resistivity of the formation 14.

In some examples, a time-lapse measurement may be performed, in which electric or magnetic fields at each sensor 20 location are measured as a function of time. In a time-lapse measurement system, first a sensor signal is recorded at a time when there is no flood. During reservoir monitoring for waterfront, a differential signal (between the no flood case and with flood case) at each sensor is recorded—which is the field due to flood. As the flood approaches closer to a sensor 20 (e.g., in a production well), the differential signal gets larger. The intensity of the signal indicates a distance to the flood front 12.

The final output of the system could either be resistivity or field due to flood, depending on a post-processing algorithm used. Direct field measurement is comparatively straightforward, while converting the direct measurement to resistivity makes the post-processing more complicated.

Basically, in the sensors 20, a physical perturbation interacts with an optical waveguide to directly modulate light traveling through the waveguide. This modulated signal travels back along the same or another waveguide to a signal interrogation system, where the signal is demodulated, and the corresponding perturbation is determined.

Preferably, an optical fiber (or another optical waveguide, such as an optical ribbon, etc.) is bonded to or jacketed by a ferromagnetic material which is a magnetostrictive material used as a magnetic field receiver. Such materials undergo a change in shape or dimension (e.g., elongation or contraction) in the presence of a magnetic field.

This property is known as magnetostriction. Some widely used magnetostrictive materials are Co, Fe, Ni, and iron-based alloys METGLAS™ and TERFENOL-D™.

The sensors 20 can be used to measure electric fields when the optical waveguide is bonded to or jacketed by a ferroelectric material which is an electrostrictive material. Ferroelectric materials undergo a change in shape or dimension in the presence of an electric field.

This property is known as electrostriction. Some examples of electrostrictive ceramics are lead magnesium niobate (PMN), lead magnesium niobate-lead titanate (PMN-PT) and lead lanthanum zirconate titanate (PLZT).

However, it should be clearly understood that the scope of this disclosure is not limited to use of any particular magnetostrictive or electrostrictive material. Any suitable material which changes shape in response to exposure to a magnetic and/or electric field may be used.

Referring additionally now to FIGS. 2-5, several examples of the sensor 20 are representatively illustrated. In each of these examples, an optical waveguide 30 is bonded or otherwise attached to a material 32 which changes shape in response to exposure to an electric and/or magnetic field.

Figure 2:
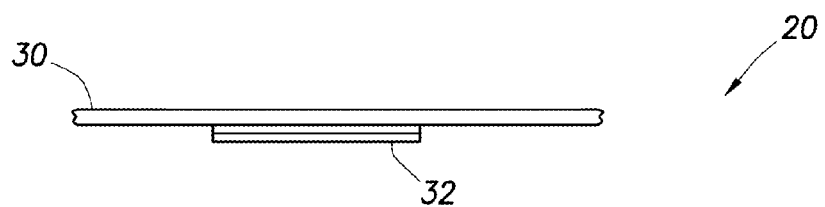
FIGS. 2-9 are representative views of optical electromagnetic sensors which may be used in the system and method of FIG. 1.

In the FIG. 2 example, the material 32 is in the form of a wire or rod which is bonded to a section of the waveguide 30. For example, an epoxy may be used to adhere the optical waveguide 30 to the material 32.

When the material 32 changes shape, the length of the optical waveguide 30 bonded to or jacketed by the material is elongated or contracted. Thus, strain is induced in the waveguide 30 due to the electromagnetic field 28.

Figure 3:
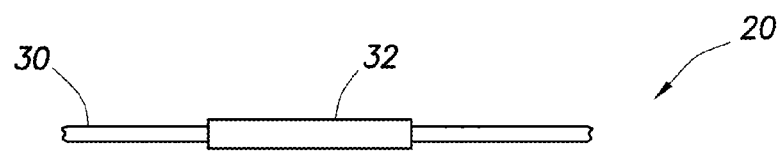

In FIG. 3, the waveguide 30 is jacketed or coated (surrounded) by the material 32. The material 32 is bonded or otherwise adhered to an outer surface of the waveguide 30.

Figure 4:
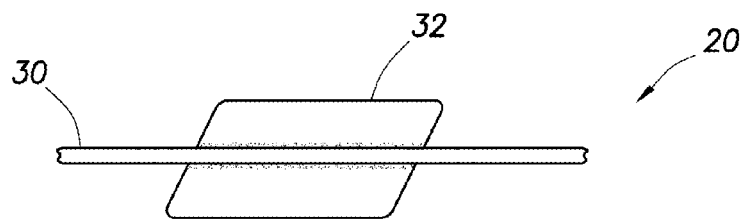

In FIG. 4, the material 32 is planar in form. Again, the material 32 is bonded to the waveguide 30.

Figure 5:
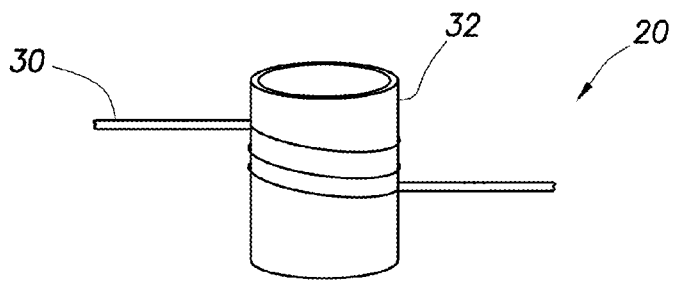

In FIG. 5, the waveguide 30 is wrapped about the material 32, which is in cylindrical form. The waveguide 30 is not necessarily bonded to the material 32, since a radial enlargement or contraction of the cylindrical material will change strain in the waveguide 30 without such bonding. However, the waveguide 30 could be bonded to the material 32 in this example, if desired.

In the FIGS. 2-5 examples, a strain (or change in length per unit length) can be induced in the waveguide 30 due to a change in shape of the material 32.

The strain (for magnetostrictive material 32) is given by:

$$\epsilon_3 = CH^2 \quad (1)$$

where C is an effective magnetostrictive coefficient, and H is a sum of alternating and direct magnetic fields ($H_{ac}$ and $H_{dc}$). Expanding the H field term, and extracting only the term that has the same frequency as the original $H_{ac}$ gives:

$$\epsilon_3 = 2CH_{ac}H_{dc} \quad (2)$$

This indicates that the strain is linearly proportional to the magnetic field.

Similarly, the strain (for an electrostrictive material 32) is given by:

$$\epsilon_3 = ME^2 \quad (3)$$

where M is an effective electrostrictive coefficient, and E is a sum of alternating and direct electric fields ($E_{ac}$ and $E_{dc}$). Expanding the E field term, and extracting only the term that has the same frequency as the original $E_{ac}$ gives:

$$\epsilon_3 = 2ME_{ac}E_{dc} \quad (4)$$

This indicates that the strain is linearly proportional to the electric field.

The strain (due to magnetostriction or electrostriction of the material 32) can be measured using interferometric methods, such as Mach-Zehnder, Michelson, Sagnac, Fabry-Perot, etc.

Figure 6:
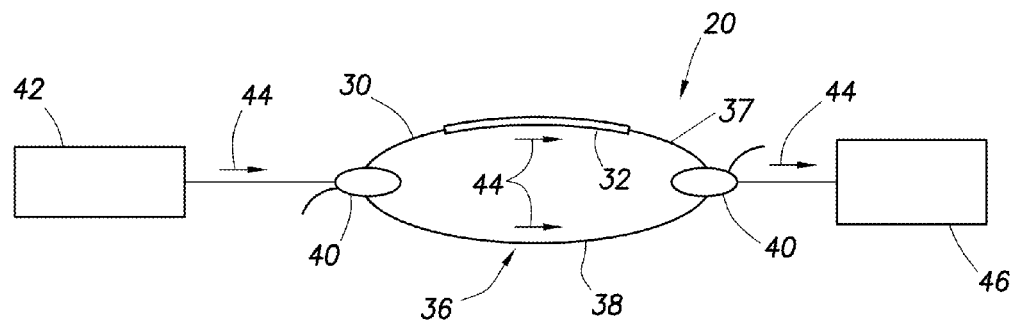

Representatively illustrated in FIG. 6 is a Mach-Zehnder interferometer 36 for measuring strain. The interferometer 36 comprises a sensing arm 37 and a reference arm 38. The material 32 is bonded to, jacketed about, or wrapped about the waveguide 30 which comprises the sensing arm 37 of the interferometer 36. The sensing arm and the reference arm 38 are connected in parallel between two optical couplers 40.

A light source 42 (such as a laser, etc.) transmits light 44 through the sensing arm 37 and the reference arm 38. An optical detector 46 receives the light, which is the interference between the lights 44 from the two arms 37, 38.

If the optical waveguide 30 undergoes strain due to exposure of the material 32 to an electric and/or magnetic field, this changes an optical path length for the light 44 in the sensing arm 37 as compared to the reference arm 38. This change in path length causes an optical phase shift between the light 44 transmitted through the sensing arm 37 and light transmitted through the reference arm 38. The phase change is given by:

$$\Delta\phi = 2\pi nL/\lambda * [\epsilon_3 - [(P_{11}+P_{12})\epsilon_1 + P_{12}\epsilon_3]n^2/2] \quad (5)$$

where $\Delta\phi$ is a difference in phase, n is the refractive index, L is a length of the waveguide 30 bonded to, jacketed by, or wrapped about the material 32, $\lambda$, is the wavelength of light 44, P11 and P12 are Pockels coefficients, and $\epsilon_1$ and $\epsilon_3$ are strains in transverse and longitudinal directions, respectively.

The phase difference $\Delta\phi$ measured using this method is proportional to the magnetic and/or electric field, which in turn is a measure of resistivity. Of course, other methods may be used for detecting the change in length of the waveguide 30, and for relating this length change to the electromagnetic field strength, in keeping with the scope of this disclosure.

In the FIG. 1 example, the sensors 20 are used for monitoring the flood front 12. The sensors 20 are deployed in the cement 22 external to the casing 24. The sensors 20 comprise a series of equal lengths of waveguide 30 bonded to, jacketed by, or wrapped about the material 32 at equal spacings along the cable 18.

At the sensor 20 locations, an optical signal (such as light 44) transmitted through the waveguide 30 is modulated by a change in shape of the material 32 due to the electromagnetic field 28. The modulated signal from each sensor 20 travels along the cable 18 to a signal interrogation device, where each sensor's signal is extracted and demodulated, enabling a determination of the electromagnetic field strength at each sensor location. In this manner, resistivity of the formation 14 can be mapped along the optical cable 18.

Figure 7:
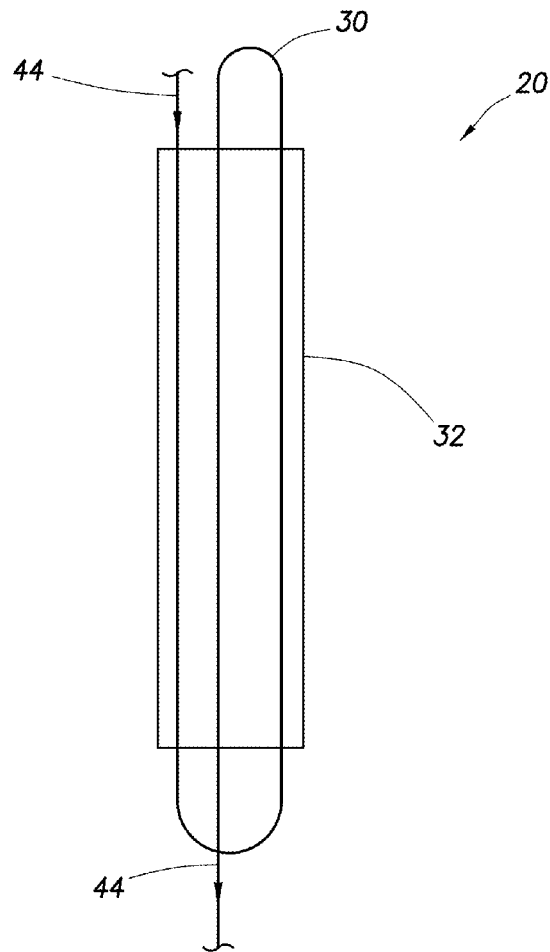

Referring additionally now to FIG. 7, another example of the sensor 20 is representatively illustrated. In this example, the waveguide 30 is bonded to the material 32 repeatedly, so that a change in shape of the material will result in larger strain in the waveguide.

A greater length of the waveguide 30 bonded to, jacketed by, or wrapped about the material 32 results in a greater total strain induced in the waveguide. This technique enhances a sensitivity of the sensor 20 to the electromagnetic field 28.

Figure 8:
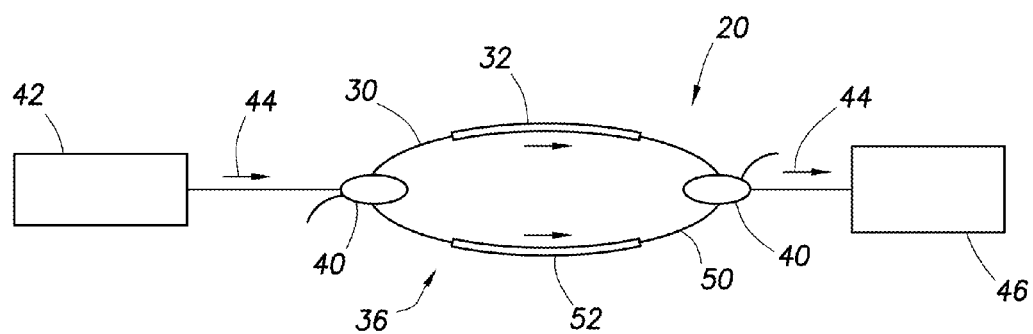

Another technique for enhancing a sensitivity of the sensor 20 is representatively illustrated in FIG. 8. This technique may be used with, for example, Mach Zehnder and Michelson interferometers, which typically have a sensing arm and a reference arm.

In the FIG. 8 example, the waveguide 30 is bonded to, jacketed by, or wrapped about the material 32. Preferably, the material 32 in this example comprises a magnetostrictive material which contracts in response to exposure to a magnetic field (negative magnetostriction).

Materials which experience negative magnetostriction include Ni, Co, ferrites, nickel ferrites and Co doped nickel ferrites.

Another arm of the interferometer 36 comprises another optical waveguide 50 which is bonded to, jacketed by, or wrapped about another material 52. Preferably, the material 52 in this example comprises a magnetostrictive material which elongates in response to exposure to a magnetic field (positive magnetostriction). Materials which experience positive magnetostriction include METGLAS™, Fe, PERMALLOY™ and TERFENOL-D™.

Thus, when the sensor 20 of FIG. 8 is exposed to a magnetic field, the arm comprising the waveguide 30 will contract, and the arm comprising the waveguide 50 will elongate. This gives a larger total difference in optical path length between the arms, as compared to the example of FIG. 6.

Since the optical path length change is greater in the FIG. 8 example, a larger phase difference will be achieved between the light 44 transmitted through the waveguide 30 and the light transmitted through the waveguide 50. This larger phase difference can be more easily measured for a given magnetic field, and small changes in the magnetic field can be more easily detected, resulting in a sensing system with higher sensitivity.

Figure 9:
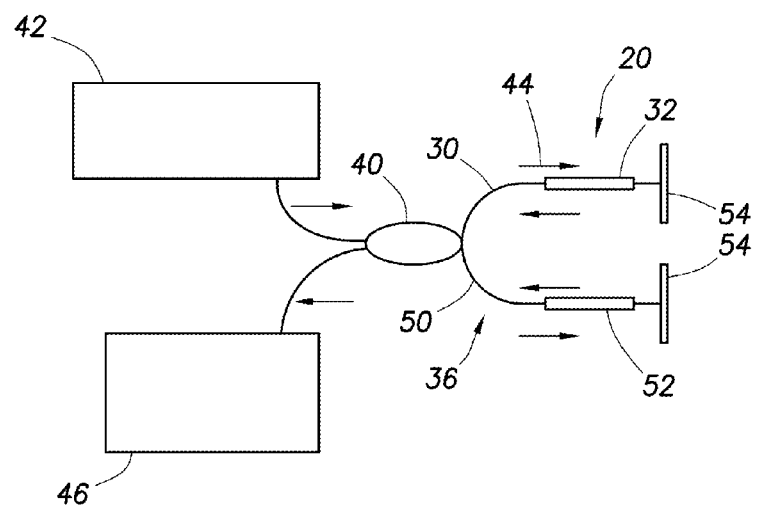

Referring additionally to FIG. 9, another example of the sensor 20 is representatively illustrated. In this example, the interferometer 36 comprises a Michelson interferometer, with Faraday mirrors 54 at ends of the waveguides 30, 50 opposite an optical coupler 40.

As with the Mach Zehnder interferometer 36 in the FIG. 8 example, the FIG. 9 Michelson interferometer has an increased difference in optical path length when the sensor 20 is exposed to a magnetic field, because the waveguide 30 contracts while the waveguide 50 elongates in response to exposure to the magnetic field. A phase change measured by the detector 46 will be larger for a given magnetic field, due to the increased difference in optical path length.

Figure 10:
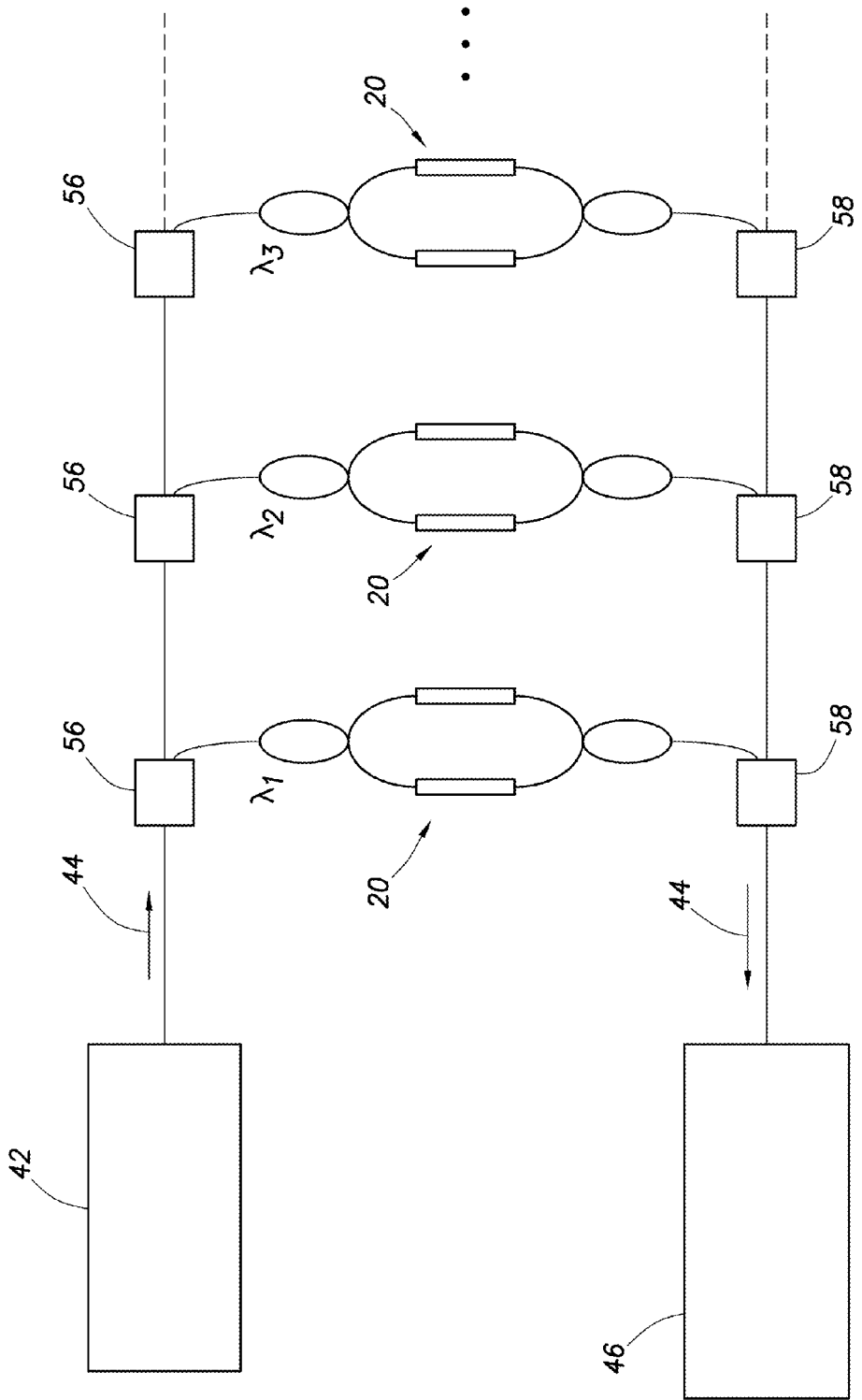
FIGS. 10-12 are representative views of multiplexing methods which may be used with the sensors.
Figure 11:
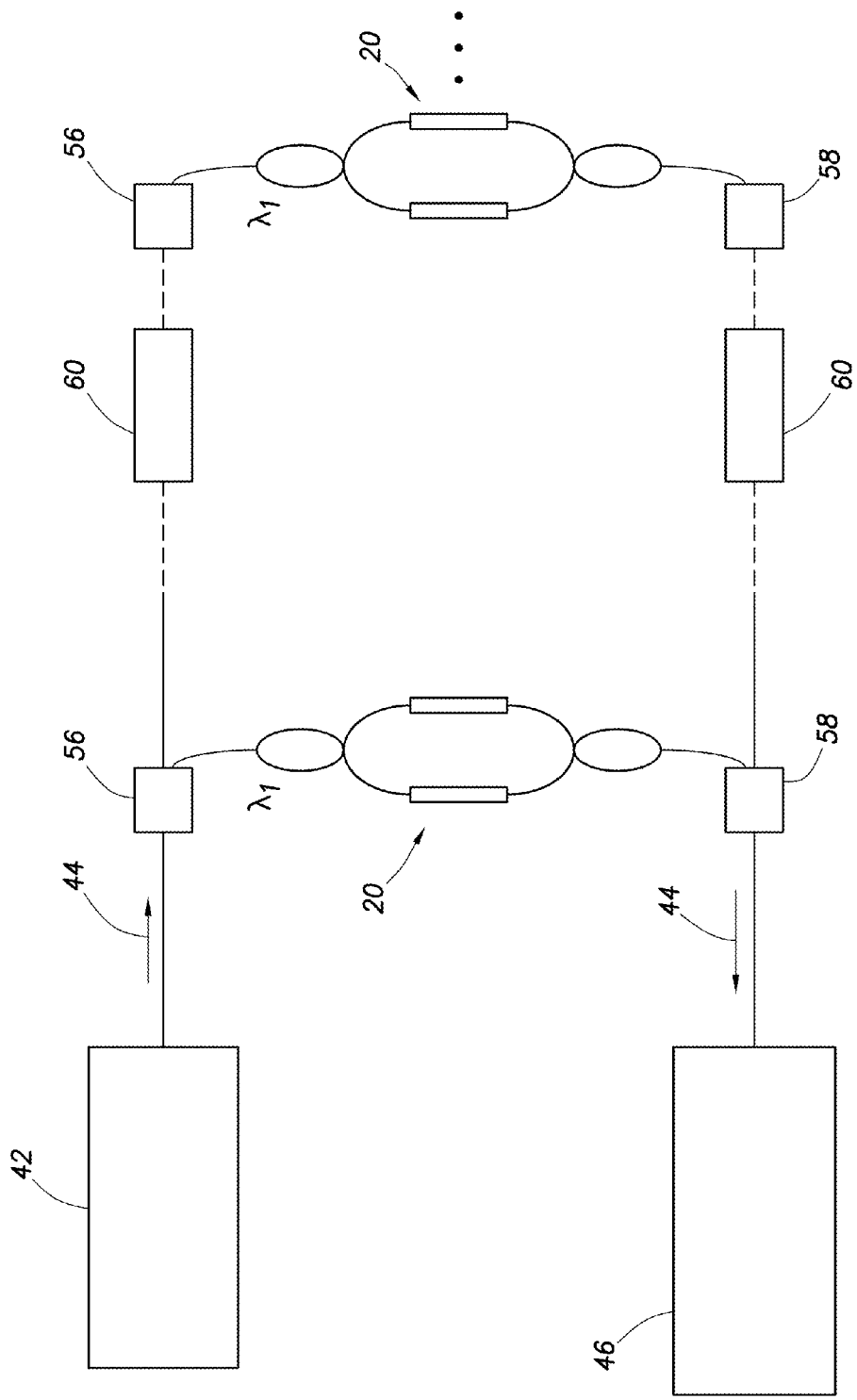
Figure 12:
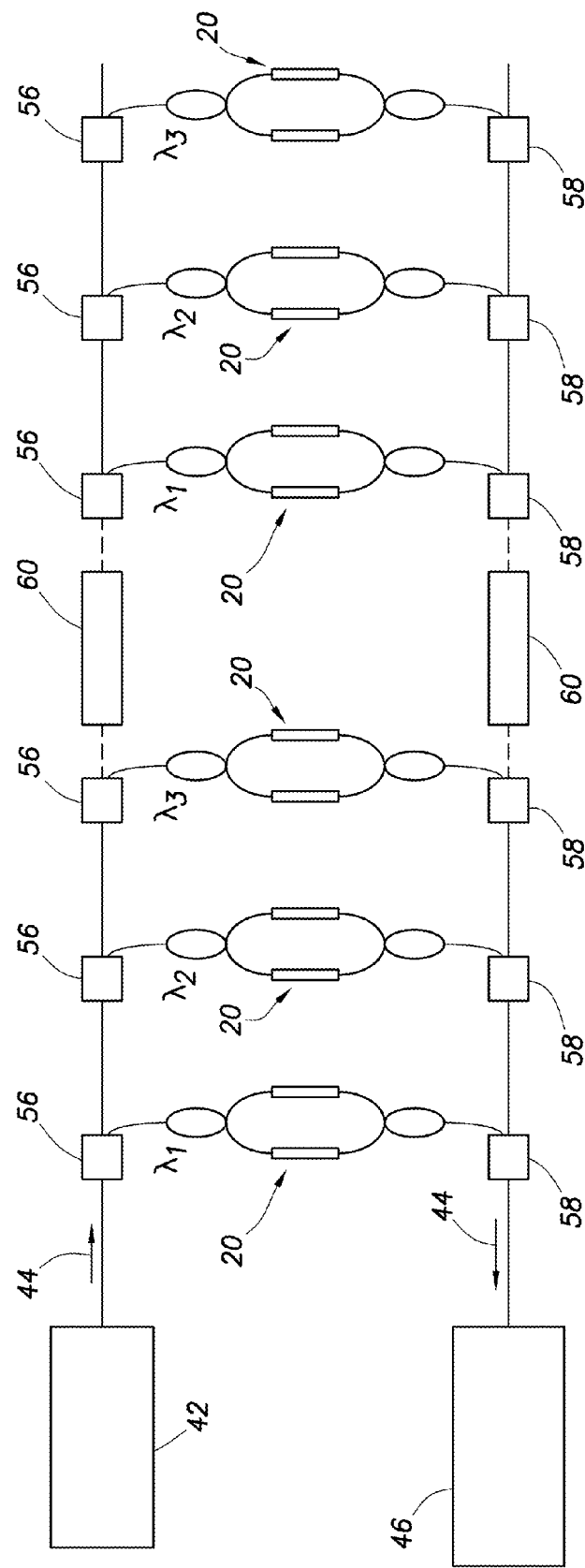

Referring additionally now to FIGS. 10-12, examples of techniques for multiplexing the sensor 20 are representatively illustrated. Wavelength division multiplexing (WDM), time division multiplexing (TDM) and hybrid examples are illustrated in the drawings, but it should be understood that any multiplexing technique may be used, in keeping with the scope of this disclosure.

For the WDM examples, a light source is preferably a broadband laser, whereas for the TDM examples the light source is preferably pulsed. For hybrid examples, preferably a broadband pulsed source is used.

In FIG. 10, WDM drops or filters 56 are used to transmit certain wavelengths ($\lambda 1, \lambda 2, \lambda 3, \ldots$) to respective ones of the sensors 20. In this example, the sensors 20 include the Mach Zehnder interferometer 36, but other types of interferometer (such as Michelson) may be used in other examples. WDM adds or couplers 58 can be used to transmit all of the wavelengths of light 44 to the detector 46 for de-multiplexing and demodulating. The light which passed through each sensor 20 is readily identified by its corresponding wavelength ($\lambda 1, \lambda 2, \lambda 3, \ldots$). Thus, FIG. 10 is an example of wavelength division multiplexing of the sensors 20.

In FIG. 11, optical delay coils 60 are used to achieve time division multiplexing. The light 44 in this example is delayed by one delay coil 60 from reaching a second sensor 20, and the other delay coil 60 again delays the light being transmitted back to the detector 46. Of course, any number of delay coils 60 (including one), and any specific delay amount, may be used in keeping with the scope of this disclosure.

Since the light 44 from the different sensors 20 will arrive at the detector 46 at respective different times, the detector can easily determine the light that was transmitted through each set of sensors. Although only two sensors 20 are depicted in FIG. 11, multiple sensors can be time division multiplexed, depending for example on required system performance.

In FIG. 12, optical delay coils 60 are used to achieve time division multiplexing, along with the wavelength division multiplexing provided by the WDM filters 56 and couplers 58. The light 44 in this example is delayed by one delay coil 60 from reaching a second set of WDM multiplexed sensors 20, and the other delay coil 60 again delays the light being transmitted back to the detector 46. Again, any number of delay coils 60 (including one), and any specific delay amount, may be used in keeping with the scope of this disclosure.

Since the light 44 from the different sets of WDM multiplexed sensors 20 will arrive at the detector 46 at respective different times, the detector can easily determine the light that was transmitted through each set of sensors. Wavelength differences in the light 44 returned to the detector 46 characterize particular sensors 20 in each set of sensors. Although only two sets of WDM and TDM multiplexed sets of sensors 20 are depicted in FIG. 12, multiple arrangements of sensors may be used in other examples, based for example on required system performance.

It may now be fully appreciated that the above disclosure provides significant advancements to the art of detecting electromagnetic fields in subterranean formations, and thereby measuring resistivities of formations. In examples described above, the sensor 20 includes an interferometer 36 with both negative and positive magnetostrictive materials 32, 52, thereby increasing a sensitivity of the sensor to changes in resistivity of the formation 14, enabling monitoring of the progress of the flood front 12 from a greater distance, and with greater accuracy. However, it is not necessary for a flood front to be monitored in keeping with the scope of this disclosure.

A method of measuring an electromagnetic field 28 in a subterranean earth formation 14 is provided to the art by the above disclosure. In one example, the method can comprise: installing at least one electromagnetic sensor 20 in a well, the sensor 20 comprising multiple optical waveguides 30, 50 and respective multiple materials 32, 52; and in response to exposure to the electromagnetic field 28, the materials 32, 52 changing shape, thereby increasing optical path length or optical phase in a first one of the optical waveguides 30 and decreasing optical path length or optical phase in a second one of the optical waveguides 50.

The changing shape step can include the first optical waveguide 30 elongating and the second optical waveguide 50 contracting. The materials 32, 52 can comprise both positive and negative magnetostrictive materials.

The optical waveguides 30, 50 may comprise legs of an interferometer 36. The materials 32, 52 can be bonded directly to the respective optical waveguides 30, 50.

The method may include permanently installing the sensor 20 in a wellbore 16. The method may include installing the sensor 20 in cement 22 between a casing 24 and a wellbore 16.

The method can include the sensor 20 detecting the electromagnetic field 28 which is related to resistivity in the formation 14.

Also described above is a well system 10. In one example, the well system 10 can include an optical electromagnetic sensor 20 installed in a well, whereby the sensor 20 measures an electromagnetic field 28 in an earth formation 14. Optical phases or path lengths in optical waveguides 30, 50 of the sensor 20 change both positively and negatively in response to exposure to the electromagnetic field 28.

The sensor 20 can include materials 32, 52 which change shape in response to exposure to the electromagnetic field 28. The optical path length/phase in the optical waveguides 30, 50 may change in response to changes in shapes of the respective materials 32, 52.

The materials 32, 52 can comprise magnetostrictive materials. In an example described above, the materials 32, 52 comprise both positive and negative magnetostrictive materials.

A method of monitoring an earth formation 14 is also described above. In one example, the method comprises:

installing at least one optical electromagnetic sensor 20 in a wellbore 16 which penetrates the formation 14; and a first optical path length in a first optical waveguide 30 of the sensor 20 increasing in response to exposure to a electromagnetic field 28, and a second optical path length in a second optical waveguide 50 of the sensor 20 decreasing in response to exposure to the electromagnetic field 28.

The sensor 20 can include first and second materials 32, 52 which change shape in response to exposure to the electromagnetic field 28. The first optical path length in the first optical waveguide 30 changes in response to a change in the first material 32 shape, and the second optical path length in the second optical waveguide 50 changes in response to a change in the second material 52 shape.

The first material 32 may comprise a positive magnetostrictive material, and the second material 52 may comprise a negative magnetostrictive material.

The method can include performing a time-lapse measurement of the electromagnetic field 28 at the sensor 20 as a function of time. A differential signal may be recorded in the time-lapse measurement, the differential signal being a difference between an output of the sensor 20 prior to a change in the formation 14, and an output of the sensor 20 after a change in the formation 14.

Although various examples have been described above, with each example having certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

Although each example described above includes a certain combination of features, it should be understood that it is not necessary for all features of an example to be used. Instead, any of the features described above can be used, without any other particular feature or features also being used.

It should be understood that the various embodiments described herein may be utilized in various orientations, such as inclined, inverted, horizontal, vertical, etc., and in various configurations, without departing from the principles of this disclosure. The embodiments are described merely as examples of useful applications of the principles of the disclosure, which is not limited to any specific details of these embodiments.

In the above description of the representative examples, directional terms (such as "above," "below," "upper," "lower," etc.) are used for convenience in referring to the accompanying drawings. However, it should be clearly understood that the scope of this disclosure is not limited to any particular directions described herein.

The terms "including," "includes," "comprising," "comprises," and similar terms are used in a non-limiting sense in this specification. For example, if a system, method, apparatus, device, etc., is described as "including" a certain feature or element, the system, method, apparatus, device, etc., can include that feature or element, and can also include other features or elements. Similarly, the term "comprises" is considered to mean "comprises, but is not limited to."

Of course, a person skilled in the art would, upon a careful consideration of the above description of representative embodiments of the disclosure, readily appreciate that many modifications, additions, substitutions, deletions, and other changes may be made to the specific embodiments, and such changes are contemplated by the principles of this disclosure. For example, structures disclosed as being separately formed can, in other examples, be integrally formed and vice versa. Accordingly, the foregoing detailed description is to be clearly understood as being given by way of illustration and example only, the spirit and scope of the invention being limited solely by the appended claims and their equivalents.

What is claimed is:

1. A method of monitoring a subterranean earth formation, the method comprising:
    installing at least one electromagnetic sensor in a well. the sensor being part of an interferometer selected from the group consisting of a Mach Zehnder interferometer and a Michelson interferometer, the sensor comprising first and second optical waveguides and respective first and second materials;
    inducing a first electromagnetic field in the subterranean earth formation at a first point in time;
    in response to exposure to the first electromagnetic field, the first and second materials changing shape, thereby increasing a first optical path length in the first optical waveguide and decreasing a second optical path length in the second optical waveguide;
    recording a first response of the at least one electromagnetic sensor to the first electromagnetic field;
    inducing a second electromagnetic field in the subterranean earth formation at a second point in time;
    in response to exposure to the second electromagnetic field, the first and second materials changing shape, thereby increasing the first optical path length in the first optical waveguide and decreasing the second optical path length in the second optical waveguide;
    recording a second response of the at least one electromagnetic sensor to the second electromagnetic field; and
    comparing the first response and the second response to monitor one or more changes in the subterranean earth formation.

2. The method of claim 1, wherein the changing shape in response to exposure to the first or second electromagnetic fields further comprises the first optical waveguide elongating and the second optical waveguide contracting.

3. The method of claim 1, wherein the first material comprises a positive magnetostrictive material, and wherein the second material comprises a negative magnetostrictive material.

4. The method of claim 1, wherein the optical waveguides comprise arms of the interferometer.

5. The method of claim 1, wherein the first and second materials are bonded to the respective first and second optical waveguides.

6. The method of claim 1, further comprising permanently installing the sensor in a wellbore.

7. The method of claim 1, further comprising installing the sensor in cement between a casing and a wellbore.

8. The method of claim 1, further comprising the sensor detecting the electromagnetic field associated with resistivity in the formation.

* * * * *